United States Patent [19]
Amon et al.

[11] Patent Number: 5,742,621
[45] Date of Patent: Apr. 21, 1998

[54] METHOD FOR IMPLEMENTING AN ADD-COMPARE-SELECT BUTTERFLY OPERATION IN A DATA PROCESSING SYSTEM AND INSTRUCTION THEREFOR

[75] Inventors: Yossi Amon, Tel-Aviv; Natan Baron, Ornit, both of Israel

[73] Assignee: Motorola Inc., Schaumburg, Ill.

[21] Appl. No.: 554,329

[22] Filed: Nov. 2, 1995

[51] Int. Cl.[6] .................................................. G06F 11/10
[52] U.S. Cl. .............................. 371/43; 371/41; 371/42; 371/37.1; 364/715.1; 364/221; 364/221.4; 395/200.31; 395/821
[58] Field of Search .......................... 371/37.1, 41, 42, 371/43; 364/715.1, 221, 221.4; 395/200.31, 821

[56] References Cited

U.S. PATENT DOCUMENTS

| | | | |
|---|---|---|---|
| 5,027,374 | 6/1991 | Rossman | 375/94 |
| 5,151,904 | 9/1992 | Reiner et al. | 371/43 |
| 5,162,797 | 11/1992 | Murata et al. | 341/107 |
| 5,164,961 | 11/1992 | Gudmundson | 375/11 |
| 5,220,570 | 6/1993 | Lou et al. | 371/43 |
| 5,243,605 | 9/1993 | Lekmine et al. | 371/43 |
| 5,390,198 | 2/1995 | Higgins | 371/43 |
| 5,412,669 | 5/1995 | Foland, Jr. | 371/43 |
| 5,432,803 | 7/1995 | Liv et al. | 371/43 |
| 5,432,804 | 7/1995 | Diamondstein et al. | 371/43 |
| 5,450,338 | 9/1995 | Oota et al. | 371/43 |
| 5,586,128 | 12/1996 | Chen | 371/43 |

OTHER PUBLICATIONS

Roger W.Wood et al., "Viterbi Detection of Class IV Partial Response on a Magnetic Recording Channel" IEEE Transactions On Communications, vol. COM-34, No.5, May 1986, pp. 454-461.

G.David Forney,Jr., "The Viterbi Algorithm", Proceedings of the IEEE, vol.61,No.3, Mar. 1973, pp. 268-278.

Dion M.Funderburk,"Motorola Digital Signal Processors-Convolutional Encoding and Viterbi Decoding Using the DSP56001 with a V.32 Modem Trellis Example",pub. by Motorola '93,pp. 1/1-4/1 & A1-C1.

Edward A.Lee et al., "Digital Communication", published by Kluwer Academic 1988, Section 7.4 Sequence Detection-The Viterbi Algorithm, pp. 268-278.

Primary Examiner—Reba I. Elmore
Assistant Examiner—McDieunel Marc
Attorney, Agent, or Firm—Daniel D. Hill

[57] ABSTRACT

A parallel data structure and a dedicated Viterbi shift left instruction minimize the number of clock cycles required for decoding a convolutionally encoded signal in a data processing system (20) in software. Specifically, the data structure and Viterbi shift left instruction reduce the number of clock cycles required for performing an add-compare-select butterfly operation. The add-compare-select butterfly operation is included in a DO loop in a plurality of instructions for executing a Viterbi decoding algorithm, and is repeated a predetermined number of times, for choosing the best path through a trellis diagram.

18 Claims, 5 Drawing Sheets

FIG.2

```
ACS BUTTERFLY - ASSEMBLY CODE

;r0 - R/W POINTER TO BRANCH METRIC TABLE.
;r4 - WRITE POINTER - PATH METRIC PRESENT STATES TABLES.
;r5 - READ POINTER - PATH METRIC TABLES PREVIOUS STATE.
;n5 - BIT-COUNT VALUE, USED FOR DECODE LOOP.
;y1 - GIVEN BRANCH METRIC FOR ACS LOOP.
;x0 - TEMPORARY REGISTER.

COMPUTE BRMTRC:
        ;PREPARE BRANCH METRIC TABLE ACCORDING TO
        ;INPUT SYMBOL. STORE VALUES IN MEMORY.
    MOVE  y:(r0)+, y1                              ;LOAD FIRST BRANCH METRIC.
    MOVE  l:(r5)+n5, a                             ;a0 ← TRELLIS, a1 ← PATH

;---------------- MAIN ACS LOOP ----------------
    DO    #NoOFACSBUTT, NEXT STAGE
    ADD   y1, a  l:(r5)-n5, b                      ;a=a+y1, b0 ← TRELLIS, b1 ← PATH METRIC
    SUB   y1, b                                    ;b=b-y1
    MAX   a,b  l:(r5)+n5, a                        ;b=MAX(a, b) | REFETCH a
    ASL   b  b1, x:(r4)                            ;LSH b0 | STORE SURVIVOR PATH METRIC
    MOVE  b0, y:(r4)+                              ;STORE SURVIVOR TRELLIS b0
    SUB   y1, a  l:(r5)-n5, b                      ;a=a-y1 | REFETCH b
    ADD   y1, b  x:(r5)+, x0  y:(r0)+, y1          ;b=b+y1 | INCREMENT r5 | LOAD NEXT BRANCH METRIC
    MAX   a, b  #1, a0                             ;b=MAX(a, b) | a ← 1
    ADDL  a,b  b1, x:(r4)                          ;b=2*b+1 | STORE SURVIVOR PATH METRIC
    MOVE  l:(r5)+n5, a                             ;FETCH NEXT a.
    MOVE  b0, y:(r4)+                              ;STORE SURVIVOR TRELLIS b0

NEXT STAGE:
    MOVE  #BRANCH_TBL, r0                          ;SET r0 TO START OF BRANCH METRIC TABLE.
```

FIG.4

```
ACS BUTTERFLY - ASSEMBLY CODE

;r0 — R/W POINTER TO BRANCH METRIC TABLE.
;r4 — WRITE POINTER — PATH METRIC PRESENT STATES TABLES.
;r5 — READ POINTER — PATH METRIC TABLES PREVIOUS STATE.
;n5 — BIT-COUNT VALUE, USED FOR DECODE LOOP.
;y1 — GIVEN BRANCH METRIC FOR ACS LOOP.
;x0 — TEMPORARY REGISTER.

COMPUTE BRMTRC:
;PREPARE BRANCH METRIC TABLE ACCORDING TO
;INPUT SYMBOL. STORE VALUES IN MEMORY.
       MOVE  y:(r0)+, y1                       ;LOAD FIRST BRANCH METRIC.
       MOVE  l:(r5)+n5, a                      ;a0 ← TRELLIS, a1 ← PATH METRIC
;----------------------- MAIN ACS LOOP -----------------------
       DO    #NoOFACSBUTT, NEXT STAGE
       ADD   y1, a  l:(r5)-n5, b               ;a=a+y1, b0 ← TRELLIS, b1 ← PATH METRIC
       SUB   y1, b                             ;b=b-y1
       MAX   a,b  l:(r5)+n5, a                 ;b=MAX(a, b) | REFETCH a
       VSL   b,  #0, l:(r4)+                   ;STORE SURVIVOR PATH METRIC AND TRELLIS
       SUB   y1, a  l:(r5)-n5, b               ;a=a-y1 | REFETCH b
       ADD   y1, b  x:(r5)+, x0  y:(r0)+, y1   ;b=b+y1 | INCREMENT r5 | LOAD NEXT BRANCH METRIC
       MAX   a, b  l:(r5)+n5, a                ;FETCH NEXT a.
       VSL   b,  #1, l:(r4)                    ;STORE SURVIVOR PATH METRIC AND TRELLIS TABLE.
NEXT STAGE:
       MOVE  #BRANCH_TBL, r0                   ;SET r0 TO START OF BRANCH METRIC TABLE.
```

*FIG.5*

METHOD FOR IMPLEMENTING AN ADD-COMPARE-SELECT BUTTERFLY OPERATION IN A DATA PROCESSING SYSTEM AND INSTRUCTION THEREFOR

FIELD OF THE INVENTION

This invention relates generally to data processing, and more particularly, to a method for implementing an add-compare-select (ACS) butterfly operation in a data processing system, and an instruction therefor.

BACKGROUND OF THE INVENTION

There are several methods for decoding convolutional codes in a communications system, such as for example, sequential decoding, threshold decoding and Viterbi decoding. The Viterbi decoding algorithm has gained wide acceptance in the area of communications, such as in cellular networks, modems, and satellite communications, for decoding convolutional codes. Briefly, the basic operation of the Viterbi decoding algorithm in digital signal processing is to select the path through a trellis that represents the most likely sequence that was generated by a convolutional encoder. A collection of branches through the trellis diagram from a beginning node to an ending node is called a path. At each node, the algorithm generates a branch metric, a measure of probability, for each branch of the trellis. Each node represents a state for a given time, and each branch represents a transition to a new state at a next instant in time. The best path to each node is then determined by examining the accumulated metrics from all paths entering the node and selecting the path with the best metric, called a survivor path, that is the maximum-likelihood path through the trellis. The best path through the trellis may be the shortest path. The other path or paths are discarded.

When implementing the Viterbi decoding algorithm in software, the branch metrics are first calculated and stored in a table, and a plurality of add-compare-select (ACS) operations are executed to calculate the best path through the trellis for each state. An ACS operation is commonly known as an ACS butterfly because of the appearance of its flow, or trellis, diagram. Each new state is calculated sequentially by applying the ACS butterfly to the previous path metric using the stored branch metrics. The amount of time and memory required to trace a path through a trellis depends on the size of the trellis. However, for a very large trellis, it may be impractical to decode a path through the trellis using the Viterbi decoding algorithm because of the large number of computations and memory accesses required.

The Viterbi decoding algorithm can be implemented in hardware or in software. When implemented in hardware, the Viterbi algorithm will generally run much faster than the Viterbi algorithm implemented in software. However, implementing the Viterbi algorithm in hardware is more expensive in terms of semiconductor surface area, complexity, and cost. Therefore, there is a need to reduce the computation time for executing the Viterbi algorithm in software.

BRIEF DESCRIPTION OF THE DRAWINGS

FIG. 4 illustrates in tabulator form, assembly code for implementing the ACS butterfly in accordance with one embodiment of the present invention.

FIG. 5 illustrates in tabulator form, assembly code for implementing the ACS butterfly in accordance with another embodiment of the present invention.

DESCRIPTION OF THE PREFERRED EMBODIMENT

Generally, the present invention provides a parallel data structure and a dedicated Viterbi specific shift left instruction for minimizing the number of clock cycles required for decoding a convolutionally encoded signal in a communications system. Specifically, the data structure and Viterbi specific instruction reduce the number of clock cycles in a data processing system that performs an ACS butterfly operation in a data processing system for choosing the best path through a trellis diagram. The data structure for performing the ACS butterfly portion of a Viterbi algorithm includes: fetching both a first previous path metric for a first state and a corresponding first trellis value during a first single clock cycle; fetching both a second previous path metric for a second state and a corresponding second trellis value during a second single clock cycle; adding a branch metric to the first path metric to obtain a first result; subtracting the branch metric from the second path metric to obtain a second result; comparing the first result to the second result, and selecting which is greater to become a first survivor metric, and refetching the first previous path metric during a third single clock cycle; storing the first survivor metric and a corresponding first trellis state; subtracting the branch metric from the first previous path metric to obtain a third result; adding the branch metric to the second previous path metric to obtain a fourth result; comparing the third result to the fourth result, and selecting which is greater, or larger, to become a second survivor metric; and storing the second survivor metric and a corresponding second trellis state.

The Viterbi shift left instruction used in the above ACS butterfly operation includes: performing a logical left shift on either the first or second trellis values and inserting a predetermined logic bit at the least significant bit location of the first or second trellis value to identify the corresponding survivor trellis state.

The parallel data structure for the ACS butterfly operation allows the Viterbi decoding algorithm to be run faster and more efficiently on the data processing system by executing some of the instructions in parallel during the same clock cycle. Also, a Viterbi shift left instruction further reduces the number of clock cycles required to run the ACS butterfly operation.

Figure 1:
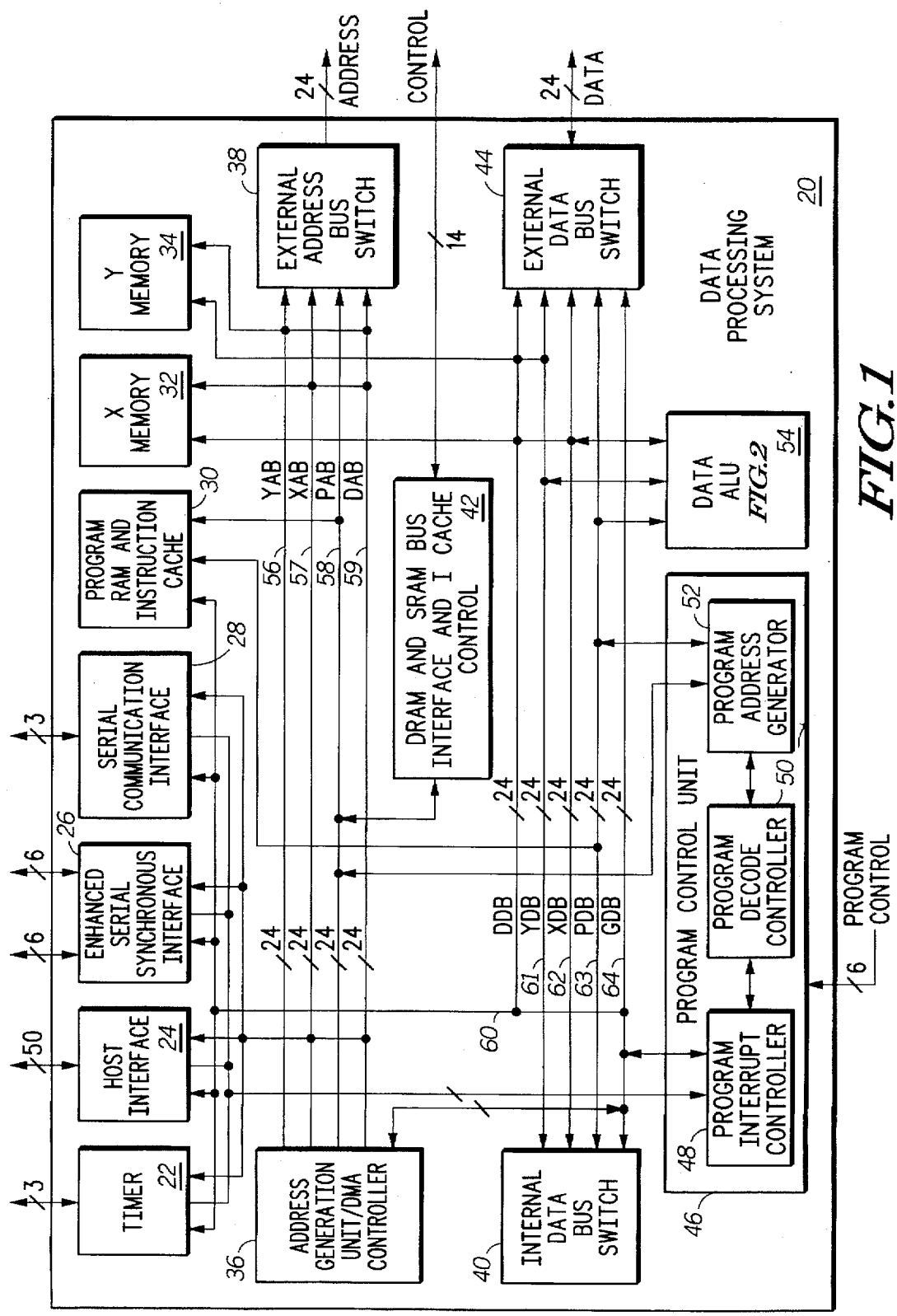
FIG. 1 illustrates in block diagram form, a data processing system in accordance with the present invention.
Figure 2:
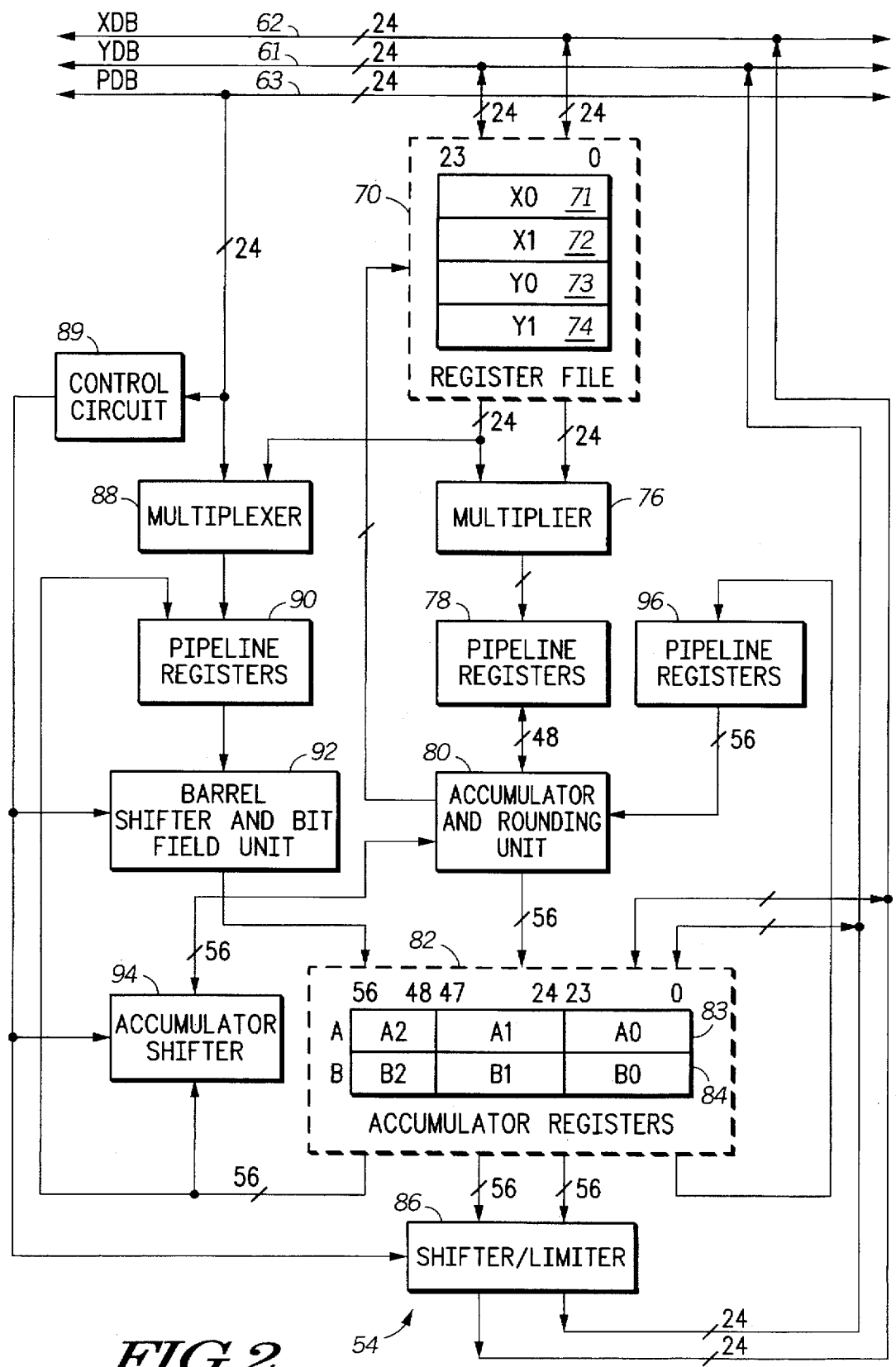
FIG. 2 illustrates in block diagram form, data arithmetic logic unit (ALU) of the data processing system of FIG. 1.
Figure 3:
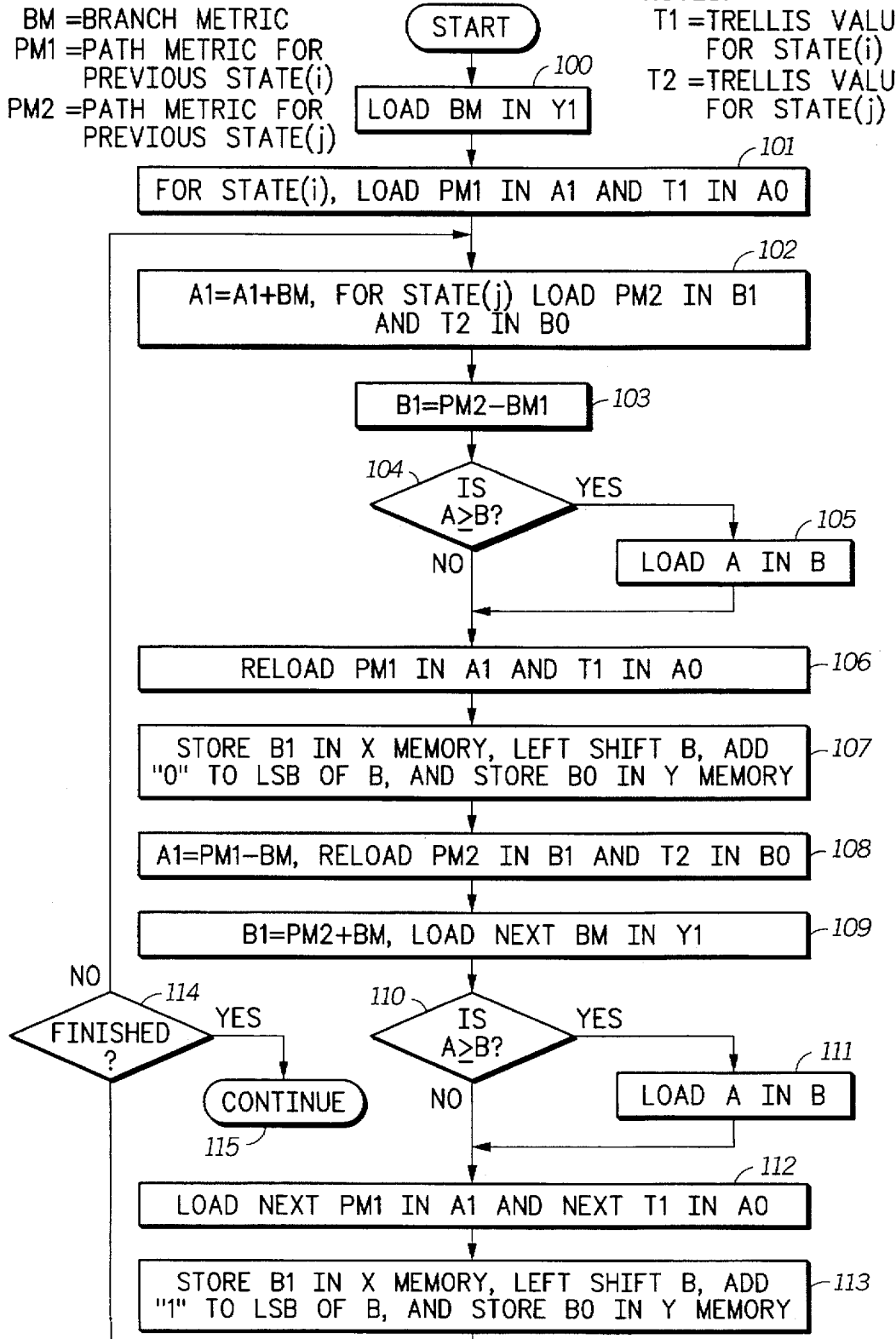
FIG. 3 illustrates in flow chart form, the ACS butterfly operation in accordance with the present invention.

The present invention can be more fully described with reference to FIGS. 1–5. Each block illustrated in FIGS. 1 and 2 represents circuitry. Each block illustrated in FIG. 3 represents one or more steps in a flow chart. FIGS. 4 and 5 illustrate two embodiments of assembly code for implementing the steps of FIG. 3. FIG. 1 illustrates in block diagram form, data processing system 20 in accordance with the present invention. In the embodiment illustrated in FIG. 1, data processing system 20 is a digital signal processor (DSP) and is located on a single integrated circuit. In other embodiments, data processing system 20 may be, for example, a microcomputer or a microprocessor.

Digital signal processing is the arithmetic processing of real-time signals sampled at regular intervals and digitized. A digital signal processor performs digital signal processing functions such as filtering, mixing, and comparison of signals. In some data processing systems, a DSP may be included with a host processor to deal with the digital signal processing chores. A host processor may include, for example, a microcomputer or a microprocessor.

Data processing system 20 includes timer 22, host interface 24, enhanced serial synchronous interface (ESSI) 26, serial asynchronous interface (SCI) 28, program RAM (random access memory) and instruction cache 30, X memory 32, Y memory 34, address generation unit/direct memory access (DMA) controller 36, external address bus switch 38, internal data bus switch 40, DRAM (dynamic random access memory) and SRAM (static random access memory) bus interface and instruction cache control 42, external data bus switch 44, program control unit (PCU) 46, and data arithmetic unit (ALU) 54. Program control unit 46 includes program interrupt controller 48, program decode controller 50, and program address generator 52.

Address bus 56, labeled "YAB", address bus 57, labeled "XAB", program address bus 58, labeled "PAB", and address bus 59, labeled "DAB", are coupled between address generation unit/ DMA controller 36 and external address bus switch 38. Data bus 60, labeled "DDB", is coupled between host interface 24 and external data bus switch 44. Data bus 61, labeled "YDB", data bus 62, labeled "XDB", program data bus 63, labeled "PDB", and program data bus 64, labeled "GDB" are coupled between internal data bus switch 40 and external data bus switch 44. The term "bus" is used to refer to a plurality of signals which may be used to transfer one or more various types of information, such as data, address, control, or status.

Timer 22 includes three timers that can use internal or external timing, and can interrupt data processing system 20 or signal an external device. In addition, timer 22 can be used to signal a DMA transfer after a specified number of events have occurred. Each of the three timers is coupled to a single bi-directional pin or terminal. In addition, each timer of timer 22 is coupled to bus 57, bus 59, program interrupt controller 48, and to bus 60.

Host interface 24 provides a bi-directional interface for communications between data processing system 20 and another device such as a microcomputer, microprocessor, or DMA controller. Also, host interface 24 is bi-directionally coupled to external data bus switch 44 via bus 60, bi-directionally coupled to global data bus 64, to program interrupt controller 48, to address generation unit/DMA controller 36, and to external address bus switch 38 via buses 57 and 59. In addition, host interface 24 is bi-directionally coupled to 50 external pins or terminals for bi-directional data transfers, address register selections, and control communications from a host processor.

Enhanced serial synchronous interface (ESSI) 26 is coupled to 12 bi-directional external pins to provide serial communication with external serial devices including, for example, one or more industry standard codecs, DSPs, or microprocessors. ESSI 26 also has terminals coupled to bus 57, bus 59, and bus 60.

Serial communication interface (SCI) 28 is coupled to 3 bi-directional external pins for providing serial communication with external devices. SCI 28 also has terminals coupled to bus 57, bus 59, and bus 60.

The embodiment of data processing system 20, illustrated in FIG. 1, has three memory spaces: program RAM and instruction cache 30, X memory 32, and Y memory 34. In other embodiments, there may be more or fewer memory spaces. Also, read only memory (ROM) may be included in other embodiments. Program RAM and instruction cache 30 are coupled to address bus 58 and to data bus 63. X memory 32 is coupled to address bus 57, address bus 59, data bus 60, and to data bus 62. Y memory 34 is coupled to address bus 56, address bus 59, data bus 60, and to data bus 61. Address generation unit/DMA controller 36 is coupled to address buses 56, 57, 58, and 59. Address generation unit/DMA controller 36 provides memory addresses to timer 22, host interface 24, ESSI 26, SCI 28, program RAM and instruction cache 30, X memory 32, Y memory 34, external address bus switch 38, and to DRAM and SRAM bus interface and instruction cache control 42. Address generation unit/DMA controller 36 provides all of the addressing modes required by DSP algorithms, such as for example, the Viterbi decoding algorithm described later. In a preferred embodiment, the DMA controller has six channels.

DRAM and SRAM bus interface and instruction cache 42 is coupled to program address bus 58 and to 14 bi-directional external pins. The instruction cache of DRAM and SRAM bus interface and instruction cache 42 functions as a buffer memory between external main memory (not shown) and program control unit 46. The instruction cache stores program instructions that are frequently used, and provides increased performance for data processing system 20 by eliminating the time required to access an external memory location for every instruction. DRAM and SRAM bus interface and instruction cache control 42 is illustrated in more detail in FIG. 2.

Internal data bus switch 40 is coupled to data bus 60, data bus 61, data bus 62, program data bus 63, and to global data bus 64. External data bus switch 44 is coupled to internal data bus switch 40 via data bus 60, data bus 61, data bus 62, program data bus 63, and to global data bus 64. In addition, external data bus switch 44 is coupled to timer 22, host interface 24, ESSI 26, and SCI 28 via data bus 60. Internal data bus switch 40 is used for transfers between buses. Any two buses can be connected together through internal data bus switch 40. External address bus switch 38 and external data bus switch 44 couple external buses (not shown) to any internal address bus and to any internal data bus, respectively.

In program control unit 46, program interrupt controller 48 arbitrates among interrupt requests, and is coupled to timer 22, host interface 24, ESSI 26, and SCI 28. Also, program interrupt controller 48 is bi-directionally coupled to global data bus 64 and to program decode controller 50. Program decode controller 50 decodes each 24-bit instruction and is bi-directionally coupled to program interrupt controller 48 and to program address generator 52. Program address generator 52 contains all of the hardware needed for program address generation, system stack, and loop control. In addition, program address generator 52 is coupled to program address bus 58 and to program data bus 63. Program control unit 46 includes a seven stage pipeline to allow one instruction to be executed per clock cycle for most instructions.

Data arithmetic logic unit (ALU) 54 is coupled to program data bus 63, data bus 61, and to data bus 62. Data ALU 54 performs all of the arithmetic and logical operations on data operands. Data ALU 54 contains registers which may be read from or written to by way of buses 61 and 62. Data ALU 54 is also coupled to bus 63 and to bus 60. Like program control unit 46, data ALU 54 also includes a seven stage pipeline for generating a result every clock cycle. Data ALU 54 will be described in more detail below.

Clock generator circuits (not shown) provide clock signals to all of the blocks shown in FIG. 1. There is also test circuitry in data processing system 20 that is not shown in FIG. 1.

FIG. 2 illustrates in block diagram form, data ALU 54 of data processing system 20 of FIG. 1 in more detail. Data is stored and operated on in signed fractional format. Data ALU 54 includes register file 70, multiplier 76, pipeline registers 78, 90, and 96, accumulator and rounding unit 80, accumulator registers 82, shifter/limiter 86, multiplexer 88, control circuit 89, barrel shifter and bit field unit 92, and accumulator shifter 94. Register file 70 includes registers 71-74. Accumulator registers 82 includes accumulator register 83 and accumulator register 84.

Register files 70 are coupled to data buses 61 and 62 for receiving data operands from X memory 32, Y memory 34, or from an external memory location (not shown). Each register of registers 71-74 is a read/write register which can store a 24 bit operand. Registers 71-74 serve as input buffer registers between data buses 61 and 62 and data ALU 54. Output terminals of register file 70 are coupled to input terminals of multiplexer 88 and to input terminals of multiplier 76. Multiplier 76 is an execution unit and comprises a conventional array multiplier such as a modified Booth's multiplier, a Wallace Tree, or the like. Multiplier 76 performs multiply operations on operands represented as fractions. In a multiply/accumulate operation, an intermediate result of a multiply operation is provided to pipeline registers 78, which temporarily stores the intermediate result prior to providing the intermediate result to accumulator and rounding unit 80. Accumulator and rounding unit 80 also functions as an execution unit in data ALU 54. Accumulator registers 83, labeled "A", and accumulator registers 84, labeled "B", each functions as a storage element, and comprises 3 concatenated registers to produce a total of 56 bits. In accumulator register 83, a 24-bit general purpose read/write register labeled "A0" stores a 24-bit least significant product (LSP). A0 comprises bits 0-23 of accumulator register 83. A 24-bit read/write register labeled "A1" stores a 24-bit most significant product (MSP). A1 comprises bits 24-47 of accumulator register 83. An 8-bit read/write register labeled "A2" is a sign extension (EXT) and overflow register. A2 comprises bits 48-56 of accumulator register 83. In accumulator register 84, a 24-bit general purpose read/write register labeled "B0" stores 24-bit LSP. B0 comprises bits 0-23 of accumulator register 84. A 24-bit read/write register labeled "B1" stores a 24-bit MSP. B1 comprises bits 24-47 of accumulator register 84. An 8-bit read/write register labeled "B2" functions as a sign extension and overflow register. B2 comprises bits 48-56 of accumulator register 84. Accumulator registers 82, and register file 70 are in a programming model for data processing system 20.

Output terminals of accumulator registers 82 are coupled to input terminals of shifter/limiter 86 for transferring 6 bits of data from accumulator registers 82 to shifter/limiter 86. Shifter/limiter 86 comprises two conventional asynchronous parallel shifter/limiters. One shifter/limiter is coupled to data bus 61 and the other shifter/limiter is coupled to data bus 62. The limiters are used to minimize errors due to overflow. Limiting occurs when the extension registers A2 and B2 are in use and the contents of accumulator register 83 or 84 are to be transmitted over data bus 61 or data bus 62. The limiter will substitute a limited data value with a maximum magnitude. If extension registers A2 and B2 are not being used, then the limiters are disabled. The two data limiters can also be combined to form one 48-bit data limiter for long-word operands. The data shifters in shifter/limiter 86 can shift data one bit to the left (scale up) or one bit the right (scale down), as well as passing the data unshifted (no scaling). The shifters permit dynamic scaling of fixed-point data without modifying the program code. For example, this permits block floating-point algorithms such as fast Fourier transforms to be implemented in data processing system 20.

Accumulator shifter 94 has input terminals coupled to output terminals of accumulator registers 82, and output terminals coupled to accumulator and rounding unit 80. Accumulator shifter 94 is an asynchronous parallel shifter for shifting the information of accumulator registers 82. Accumulator shifter 94 then provides the shifted information back to accumulator and rounding unit 80. Control circuit 89 is coupled to accumulator shifter 94, shifter/limiter 86, and barrel shifter and bit field unit 92. Control circuit 89 performs the control functions for data ALU 54 in response to instructions received from program control unit 46 by way of bus 63. For example, control circuit 89 determines the shifting operations required for the ACS butterfly operation described later in conjunction with FIGS. 3, 4, and 5.

Multiplexer 88 has input terminals coupled to bus 63 and to register file 70. Output terminals of multiplexer 88 are coupled to input terminals of pipeline registers 90. Output terminals of pipeline registers 90 are coupled to barrel shifter and bit field unit 92. Barrel shifter and bit field unit 92 is coupled to input terminals of accumulator registers 82. Barrel shifter and bit field unit 92 contains a 56-bit parallel bi-directional shifter, and performs multibit left shift, multibit right shift, 1-bit rotate (left or right), bit field merge, insert and extract, count leading bits normalization, and logical operations such as AND, OR, exclusive OR, and NOT. Barrel shifter and bit field unit 92 can perform all of these operations for the 24-bit and 16-bit exact modes of operation. In the 16-bit exact mode, the bit field operations are performed on the appropriate bit position for 16-bit data.

When moving data from bus 61 or bus 62 into one of registers 71-74, the 16 least significant bits on the bus will be loaded into the 16 most significant bits of the destination register. Zeros are loaded into the 8 least significant bits of the register. When moving data from bus 61 or bus 62 into a 48-bit register, such as a register formed by concatenating two registers of registers 71-74, the 16 least significant bits of bus 62 are loaded into the 16 most significant bits of registers 72 or 74, and the 16 least significant bits of bus 61 are loaded into the 16 most significant bits of registers 71 or 73.

FIG. 3 illustrates in flow chart form, an embodiment of the ACS butterfly operation in accordance with the present invention. Diamond-shaped boxes 104, 110, and 114 represent decision steps, and rectangular boxes 100-103, 105 109, and 111-113 represent steps which are followed in order to perform one iteration, or loop, of the ACS butterfly for a data processing system that uses the Viterbi decoder algorithm to find the best path from a previous state to a present state of a trellis. In one embodiment, the ACS butterfly is included as a DO loop within a set of instructions for decoding convolutional codes using the Viterbi decoder algorithm. The ACS butterfly performs the calculations required to select the path through the trellis that represents the most likely sequence that was generated by a convolutional encoder. A plurality of the ACS butterfly operations are repeatedly executed a predetermined number of times, or iterations, to calculate the best path through the trellis for each state. Each new state is calculated sequentially by applying the ACS butterfly to the previous path metric using the stored branch metrics.

Note that there are several known methods for calculating the most likely sequence through the trellis. The method of the illustrated embodiment requires maximizing accumulated path metrics by choosing the path metric with the largest value. Other embodiments may require minimizing accumulated path metrics to choose the shortest path through the trellis.

To perform the ACS butterfly operation, branch metrics are first calculated and stored in a table in Y memory 34 pointed to by an effective address stored in a pointer register located in address generation unit/DMA controller 36. In other embodiments, the ACS butterfly operation can be used as a "macro", without having a full branch metric table, with few changes in the code illustrated in FIGS. 4 and 5. For example, if an inverse of a branch metric is needed, the order of the ADD and SUB operations may be reversed in the code illustrated in FIG. 4 to give an inverted branch metric, thus allowing a smaller branch metric table to be used in applications requiring the use of branch metrics and their inverses. Also, whether the branch metric address pointer is incremented, decremented, or neither, depends on the particular application, and can be different in other embodiments. Each branch metric is defined as a measure of distance determined by some form of comparison between a received input symbol and a corresponding branch in the trellis diagram. The term "symbol" refers to information communicated between an encoder of a transmitter and a decoder of a receiver of a communications system. The calculation of branch metrics is not relevant to the present invention and will not be discussed further since metric calculation is well documented in existing literature.

At step 100, the first branch metric (BM) is moved into register 74 (Y1) from a predetermined location of Y memory 34, that is pointed to by an effective address stored in address generation unit/DMA controller 36, via data bus 61. The effective address is incremented by one. At step 101, a first previous path metric (PM1) for a state (i) and a corresponding first trellis value (T1) are fetched from predetermined locations in X memory 32 and Y memory 34, respectively, and loaded into accumulator register 83 (A). A first previous path metric is loaded in the 24 accumulator register bits labeled A1. The first trellis value is loaded in the 24 bits labeled A0 of accumulator register 83. The path metrics and trellis values are binary values.

Step 102 is the first step of a DO loop for the ACS butterfly operation. At step 102, the branch metric is added to the first previous path metric using accumulator and rounding unit 80, and the result stored back in accumulator register bits A1. In parallel with the addition operation of step 102, and within a same single clock cycle, a second previous path metric (PM2) for state (j), and a corresponding second trellis value (T2) are fetched, or moved, from predetermined locations in X memory 32 and Y memory 34, respectively, and loaded into accumulator register 84 (B). At step 103, the branch metric from register 74 is subtracted from the second path metric using accumulator and rounding unit 80. The result of the subtraction is reloaded into register bits B1 of accumulator register 84.

At decision step 104, the first and second previous path metrics are examined in view of the branch metric to determine the survivor path metric and corresponding trellis. The result in accumulator register 83 (A) is compared to the result in accumulator register 84 (B) to determine a first survive path metric and trellis. If the result in accumulator register 84 (B) is less than the result in accumulator register 83 (A), then the result in accumulator register 83 (A) is the first survivor path metric, and the YES path is taken to step 105. Note that decision steps 104, 110, and 114 are 56-bit operations, and are therefore performed on the whole accumulator register 83 or 84.

In the case where the result in accumulator register bits A1 is equal to the result in accumulator register bits B1, there are several ways to determine the survivor path metric and trellis. For example, the determination may be arbitrary. However, in the illustrated embodiment, the determination is made by examining the corresponding trellis values, necessitated by a hardware limitation in ALU 54 which requires the comparison operation to be performed on all 56 bits of an accumulator register. However, determination of the survivor path metric in the case where the result in accumulator register 83 (A) is equal to the result in accumulator register 84 (B) is not important for describing the invention and will not be discussed further.

At step 105, the result, or first survivor path metric and trellis, located in accumulator register 83 (A), is loaded into accumulator register 84 (B) and is the first survivor path metric and corresponding trellis.

At step 106, the first previous path metric and corresponding first trellis value are reloaded into accumulator register bits A1 and A0, respectively.

Referring back to decision step 104, if the result in accumulator register 83 (A) is less than the result in accumulator register 84 (B), then the result already loaded in accumulator register 84 (B) is the first survivor path metric, and the NO path is taken from decision step 104 to step 106 (step 106 was described above). At step 107, the contents of accumulator register bits B1 are stored at a predetermined location of X memory 32. A logical left shift is performed on accumulator register 84 (B) using accumulator shifter 94, and a logic "zero" is loaded into the least significant bit of accumulator register bits B0. The contents, or binary value of accumulator register bits B0 are stored at a predetermined location of Y memory 34. The predetermined location of X memory 32 and Y memory 34 is determined by a first effective address stored in a pointer register in address generation unit/DMA controller 36. The first effective address is incremented by a predetermined amount as determined by an address offset register to point to a second effective address for storing the next survivor path metric and trellis state.

At step 108, the branch metric is subtracted from the first previous path metric (PM1) using accumulator and rounding unit 80, and the result loaded into accumulator register bits A1 of accumulator register 83. In parallel with the subtraction operation of step 108, and within the same clock cycle, the second previous path metric (PM2) is reloaded into accumulator register bits B1 and the corresponding second trellis value (T2) is reloaded into accumulator register bits B0 of accumulator register 84. At step 109, the branch metric, located in Y register 74 (Y1), which was first loaded at step 100, is added to the first previous path metric (PM1) and the result loaded into accumulator register bits B1. In order to set up for the next cycle of the ACS butterfly DO loop, the next branch metric is loaded into register 74 (Y1) within the same single clock cycle as the addition operation of step 109.

At decision step 110, the result in accumulator register 83 (A) is compared to the result in accumulator register 84 (B) to determine a second survive path metric. If the result in accumulator register 84 (B) is less than the result in accumulator register 83 (A), then the result in accumulator register bits A1 is the second survivor path metric, and the YES path is taken from decision step 110 to step 111. At step 111, the result (second survivor path metric and corresponding trellis value) in accumulator register 83 (A) is loaded into accumulator register 84 (B). At step 112, the next previous path metric and corresponding next trellis value are loaded to accumulator register bits A1 and A0, respectively, ready for the next loop of the ACS butterfly.

If the result in accumulator register 83 (A) is less than the result in accumulator register 84 (B), then the result already loaded in accumulator register 84 (B) is the second survivor path metric, and the NO path is taken from decision step 110 to step 112 (step 112 is described above). At step 113, the contents of accumulator register bits B1 are stored at a predetermined location of X memory 32. A logical left shift is performed on accumulator register 84 (B) by accumulator shifter 94, and a logic "one" is loaded into the least significant bit of accumulator register bits B0. The contents of accumulator register bits B0 are stored at a predetermined location of Y memory 34. The predetermined locations of X memory 32 and Y memory 34 are determined by the second effective address stored in a pointer register in address generation unit/DMA controller 36. The second effective address is incremented. At step 114, it is determined whether or not the preprogrammed number of loops have been completed. If the preprogrammed number of loops have been completed, the YES path is taken to step 115, and the Viterbi decoder program continues. If the preprogrammed number of loops have not been completed, the NO path is taken back to the beginning of the ACS butterfly DO loop at step 102 to begin another iteration of the ACS butterfly.

FIG. 4 illustrates in tabulator form, Motorola assembly code for implementing the ACS butterfly in a DSP, such as a Motorola DSP5DSP56601, DSP56601, in accordance with one embodiment of the present invention assembly code of FIG. 4 illustrates that certain instructions allow a parallel "move" operation to occur within the same clock cycle as the ALU operation. This permits one loop of the ACS butterfly to be completed in 14 clock cycles when executed in a Motorola DSP56301 or a Motorola DSP 56601. Note that due to the parallel execution of some instructions and the use of pipelining in data ALU 54 (FIG. 2), "pipe stalls", or "interlocks", occur. The interlocks are accounted for in the execution time of one loop and are not shown.

FIG. 5 illustrates in tabulator form, assembly code for implementing the ACS butterfly in a DSP, such as for example, the Motorola DSP56301 or the Motorola DSP56601, in accordance with another embodiment of the present invention. The assembly code of FIG. 5 differs from the assembly code of FIG. 4, in that a dedicated Viterbi shift left instruction is included in the assembly code of FIG. 5 to further reduces the number of clock cycles required to perform one loop of the ACS butterfly from 14 clock cycles to 10 clock cycles. This may be a substantial reduction in the time required for computing accumulated path metrics in software for a relatively large trellis requiring a large number of iterations.

In Motorola assembly code, the Viterbi shift left instruction has the format, VSL S,i,L:ea, where VSL is the operation code. The VSL instruction causes the binary value of accumulator register bits A1 or B1 of the designated source accumulator (S) to be stored in X memory 32 at the effective address (ea), while the binary value of accumulator register bits A0 or B0 are shifted one bit to the left and either a logic "one" or a logic "zero" is added at the least significant bit location according to the operand (i). Then the binary value of accumulator register bits A0 or B0 of the designated source accumulator (S) are stored in Y memory 34 at the effective address (ea). The Viterbi shift left instruction is executed within a single clock cycle of data processing system 20, and is used twice in the assembly code illustrated in FIG. 5. The first use of the Viterbi shift left instruction is used to store the survivor path metric for an even Trellis state. The even trellis states are those trellis states having a logic zero left shifted in. The second use of the Viterbi shift left instruction is used to store the survivor path metric for an odd Trellis state. The odd trellis states are those trellis states having a logic one left shifted The parallel data structure allows the Viterbi decoder algorithm to be executed faster in software in data processing system 20, by allowing data to be moved at the same time, or during the same clock cycle, that an ALU instruction is being executed. Also, a dedicated Viterbi shift left instruction further reduces the number of clock cycles required to run the ACS butterfly operation, permitting more efficient use of data processing time.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for performing an add-compare-select butterfly operation for implementing a Viterbi decoder in a data processing system, the method comprising the steps of:

loading a branch metric into a first storage element;

loading both a first previous path metric and a first trellis value into a second storage element;

loading both a second previous path metric and a second trellis value into a third storage element;

determining which of the first previous path metric and the second previous path metric is a survivor path metric using the branch metric;

storing the survivor path metric, and a corresponding survivor trellis state in a fourth storage element; and performing a logical left shift on either the first or second trellis values and inserting a predetermined logic bit at a least significant bit location of the first or second trellis value to identify the corresponding survivor trellis state.

2. The method of claim 1, wherein the step of determining comprises the steps of:

adding the branch metric to the first previous path metric to obtain a first result and storing the first result in the first storage element;

subtracting the branch metric from the second previous path metric to obtain a second result and storing the second result in the second storage element; and comparing the first result to the second result, wherein the larger of the first and second result is the survivor path metric.

3. The method of claim 2, further comprising the steps of:

subtracting the branch metric from the first previous path metric to obtain a third result and storing the third result in the first storage element;

adding the branch metric to the second previous path metric to obtain a fourth result and storing the fourth result in the second storage element;

comparing the first result to the second result, wherein the larger of the third and fourth results is a second survivor path metric; and storing the second survivor path metric, and a corresponding survivor trellis state in a fifth storage element.

4. The method of claim 1, wherein the step of determining comprises selecting the survivor path metric by maximizing path metrics.

5. The method of claim 1, wherein the first storage element and the second storage element are characterized as being accumulator registers in the data processing system.

6. The method of claim 1, wherein the steps are repeated for a predetermined number of iterations.

7. A method for performing an add-compare-select butterfly operation for implementing a Viterbi decoder in a data processing system, the method comprising the steps of:

fetching a first previous path metric for a first state and a corresponding first trellis value during a first single clock cycle;

fetching a second previous path metric for a second state and a corresponding second trellis value during a second single clock cycle;

adding a branch metric to the first previous path metric to obtain a first result;

subtracting the branch metric from the second previous path metric to obtain a second result;

comparing the first result to the second result, and selecting which is greater to become a first survivor metric, and refetching the first previous path metric during a third single clock cycle;

storing the first survivor metric and a corresponding first trellis state, wherein the corresponding first trellis state is determined by left shifting the first trellis value and adding a first predetermined bit to a least significant bit of the left shifted first trellis value;

subtracting the branch metric from the first previous path metric to obtain a third result;

adding the branch metric to the second previous path metric to obtain a fourth result;

comparing the third result to the fourth result, and selecting which is greater to become a second survivor metric; and storing the second survivor metric and a corresponding second trellis state, wherein the corresponding second trellis state is determined by left shifting the second trellis value and adding a second predetermined bit to a least significant bit of the left shifted second trellis value.

8. The method of claim 7, further comprising repeating the steps for a predetermined number of iterations.

9. The method of claim 7, wherein the first predetermined bit represents a logic zero.

10. The method of claim 9, wherein the steps of left shifting, adding a logic zero, and storing the first survivor metric and the first trellis state are executed within a same clock cycle.

11. The method of claim 7, wherein the second predetermined bit represents a logic one.

12. The method of claim 11, wherein the steps of left shifting, adding a logic one, and storing the second survivor metric and the second trellis state are executed within a same clock cycle.

13. In a data processing system, a method for use in an add-compare-select operation of a Viterbi decoding algorithm, the method comprising the steps of:

fetching a first previous path metric and a corresponding first trellis value;

fetching a second previous path metric and a corresponding second trellis value; and examining the first and second previous path metrics and a branch metric to determine a survivor path metric;

moving the survivor path metric from a first memory location to a second memory location;

left shifting the first trellis value to obtain a left shifted first trellis value;

adding a predetermined bit to a least significant bit location of the left shifted first trellis value to determine a corresponding first trellis state; and moving the corresponding first trellis state to the second memory location.

14. The method of claim 13, wherein the step of examining the first and second previous path metrics further comprises the steps of:

adding a branch metric to the first previous path metric to obtain a first result;

subtracting the branch metric from the second previous path metric to obtain a second result; and comparing the first result to the second result, and selecting which is greater to become the survivor path metric.

15. A method for performing an add-compare-select butterfly operation in a data processing system, the method comprising the steps of:

fetching a first previous path metric and a corresponding first trellis value;

fetching a second previous path metric and a corresponding second trellis value;

examining the first and second previous path metrics and a branch metric based on a predetermined calculation, to determine a first survivor path metric; and storing the first survivor path metric in a predetermined memory location, performing a logical left shift on either the first trellis value or the second trellis value, as determined by the first survivor path metric, inserting a first predetermined logic bit at a least significant bit location of the first trellis value or the second trellis value to identify a corresponding first trellis state, and storing the corresponding first trellis state in the predetermined memory location, all within a single clock cycle of the data processing system.

16. The method of claim 15, wherein the step of examining the first and second previous path metrics comprises the steps of:

adding a branch metric to the first previous path metric to obtain a first result;

subtracting the branch metric from the second previous path metric to obtain a second result; and comparing the first result to the second result, and selecting which is greater to become the first survivor path metric.

17. The method of claim 16, further comprising the steps of:

subtracting the branch metric from the first previous path metric to obtain a third result;

adding the branch metric to the second previous path metric to obtain a fourth result; and comparing the third result to the fourth result, and selecting which is greater to become a second survivor path metric.

18. The method of claim 17, further comprising a step of storing the second survivor path metric, performing a logical left shift on either the first trellis value or the second trellis value, as determined by the second survivor path metric, inserting a second predetermined logic bit at the least significant bit location of first trellis value or the second trellis value to identify a corresponding second trellis state, and storing the corresponding trellis state, all within a single clock cycle of the data processing system.

* * * * *